United States Patent [19]

Mueller

[11] Patent Number: 4,835,485

[45] Date of Patent: May 30, 1989

[54] UNCONDITIONALLY-STABLE ULTRA LOW NOISE R.F. PREAMPLIFIER

[75] Inventor: Otward M. Mueller, Ballston Lake, N.Y.

[73] Assignee: General Electric Company, Schenectady, N.Y.

[21] Appl. No.: 172,828

[22] Filed: Mar. 25, 1988

[51] Int. Cl.[4] .......................... H03F 3/16; H03F 3/191
[52] U.S. Cl. ..................... 330/277; 330/302; 330/304
[58] Field of Search ............... 330/53, 277, 286, 302, 330/303, 304, 305, 306, 311

[56] References Cited

U.S. PATENT DOCUMENTS 4,511,813  4/1985  Pan .................................. 330/277 X
4,658,220  4/1987  Heston et al. ................... 330/286 X

OTHER PUBLICATIONS

Riml, Peter "13-cm GaAsFET Preamp", *QST*, Aug. 1984, p. 65.

"VHF Preamplifiers", GH Krauss, *Ham Radio*, Dec. 1979, pp. 50-60.

"VHF and UHF Low Noise Preamplifiers", GH Krauss, *QEX*, Dec. 1981, pp. 3-6.

*Primary Examiner*—Steven Mottola
*Attorney, Agent, or Firm*—Geoffrey H. Krauss; James C. Davis, Jr.; Marvin Snyder

[57] ABSTRACT

An unconditionally-stable, ultra-low-noise RF preamplifier, for an operating frequency within the range from about 15 MHz. to about 500 MHz., has a first stage in which a MESFET device is operated in the common-source configuration, with an active load providing an effective impedance to the first stage to cause the stability factor K for the entire preamplifier to exceed a value of 1.00 over the entire frequency range. A second stage, acting as at least a portion of the active load on the first state, containing a plurality of active devices coupled in parallel to provide a substantially constant input impedance over the frequency range.

14 Claims, 3 Drawing Sheets

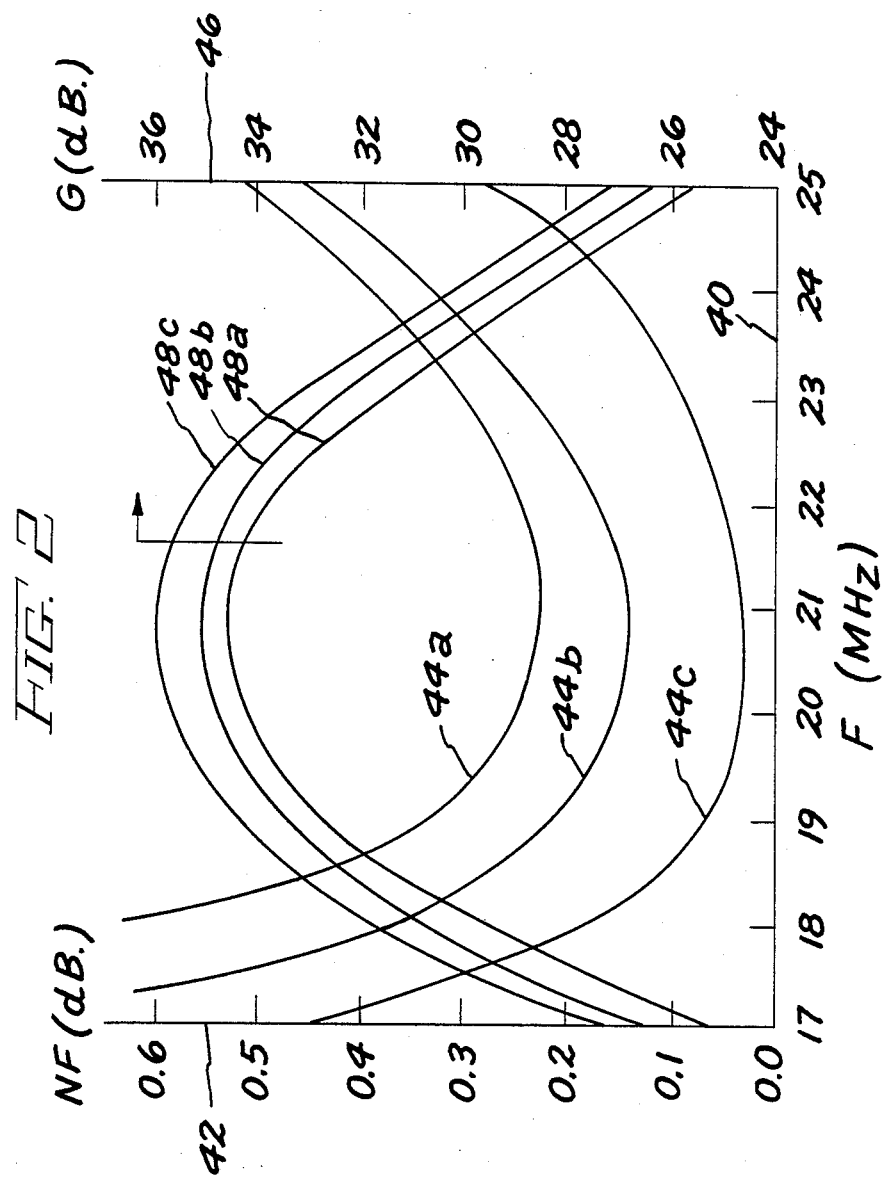

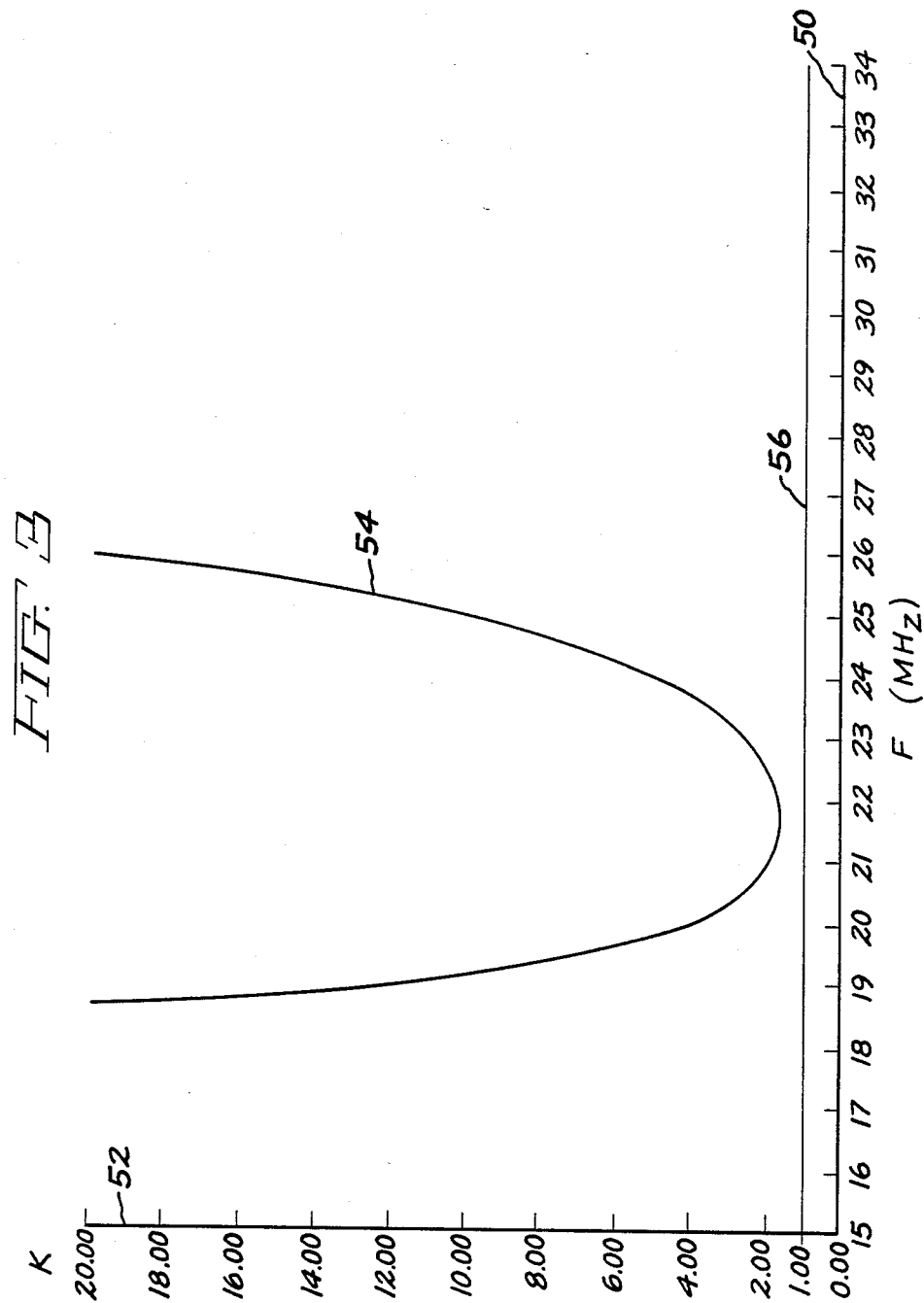

UNCONDITIONALLY-STABLE ULTRA LOW NOISE R.F. PREAMPLIFIER

BACKGROUND OF THE INVENTION

The present invention relates to radio frequency (RF) reception apparatus and, more particularly, to a novel ultra-low-noise RF preamplifier having unconditional stability and large dynamic range.

It is well known that many forms of RF reception equipment, for communications, magnetic resonance imaging (MRI) and the like uses, can benefit from a small-signal RF preamplifier having relatively high gain (in excess of 20 dB.) along with a ultra low noise figure (less than 0.3 dB.). at an operating frequency in the approximately five octave range from about 15 MHz. to about 500 MHz. It has been possible, since the latter part of the 1970s, to provide bipolar transistor RF preamplifiers having a low noise figure (NF) between about 0.8-1.0 dB. over most of this frequency range. Very low noise preamplifiers, with noise figures in the range of 0.4-0.8 dB., were then available utilizing gallium-arsenide MESFETs, or GaAsFETs, for frequencies only above about 100 MHz. (See, for a general overview, "VHF Preamplifiers", GH Krauss Ham Radio, December, 1979.) While the use of microwave GaAsFETs in very low noise preamplifiers has now become relatively common place, above 50 MHz., a continuing problem is the potential instability (i.e., a stability factor K of less than 1) of all hitherto-described preamplifiers in which a common-source input stage configuration is utilized. Since the common-source configuration is the only configuration presently known to provide a truly low noise figure, the potential instability, particularly at the frequency of interest, signifies a RF preamplifier which tends towards oscillation at some unknown frequency, due to the reactive nature of at least one of the source impedance and load impedance seen by that RF preamplifier. This is especially so where relatively narrow-bandpass filters are also utilized before and/or after the RF preamplifier in many applications where the extreme sensitivity of the RF preamplifier and/or the subsequent reception apparatus can be adversely affected by transmission of signals at undesired frequencies. Accordingly, it is highly desirable to provide an unconditionally-stable, ultra-low-noise RF preamplifier (having a noise figure less than about 0.3 dB.) at a frequency of interest in the 15-500 MHz. range.

BRIEF SUMMARY OF THE INVENTION

In accordance with the invention, an unconditionally-stable, ultra-low-noise RF preamplifier for an operating frequency within the range from about 15 MHz. to about 500 MHz., comprises a first stage in which a MESFET device is operated in the common-source configuration, with a series L-C noise-matching input network, and with an active load providing an effective impedance to the first stage to cause the stability factor K for the entire preamplifier to exceed a value of 1.00 over the entire frequency range; and a second stage, acting as at least a portion of the active load on the first stage, containing a plurality of active devices coupled in parallel to provide a substantially constant input impedance over the frequency range.

In a presently preferred embodiment, the second stage comprises a plurality of JFETs or GaAs-MESFETS, all having their control-conduction channels coupled in parallel with one another; a common output of the paralleled active devices of the second stage is coupled through an impedance-changing circuit to the RF preamplifier output.

Accordingly, it is an object of the present invention to provide a novel RF preamplifier circuit which is unconditionally stable while simultaneously having an ultra low noise figure.

This and other objects of the present invention will become apparent upon reading the following detailed description, when considered in conjunction with the associated drawings.

BRIEF DESCRIPTION OF THE DRAWINGS

FIG. 2 is a graph illustrating the noise figure and gain of one such RF preamplifier, tuned for use at a specific frequency within the broad unconditionally-stable frequency range of the RF preamplifier circuit; and FIG. 3 is a graph of the stability factor K, over a wide range of frequencies, for the RF preamplifier having the properties illustrated in FIG. 2.

DETAILED DESCRIPTION OF THE INVENTION

Figure 1:
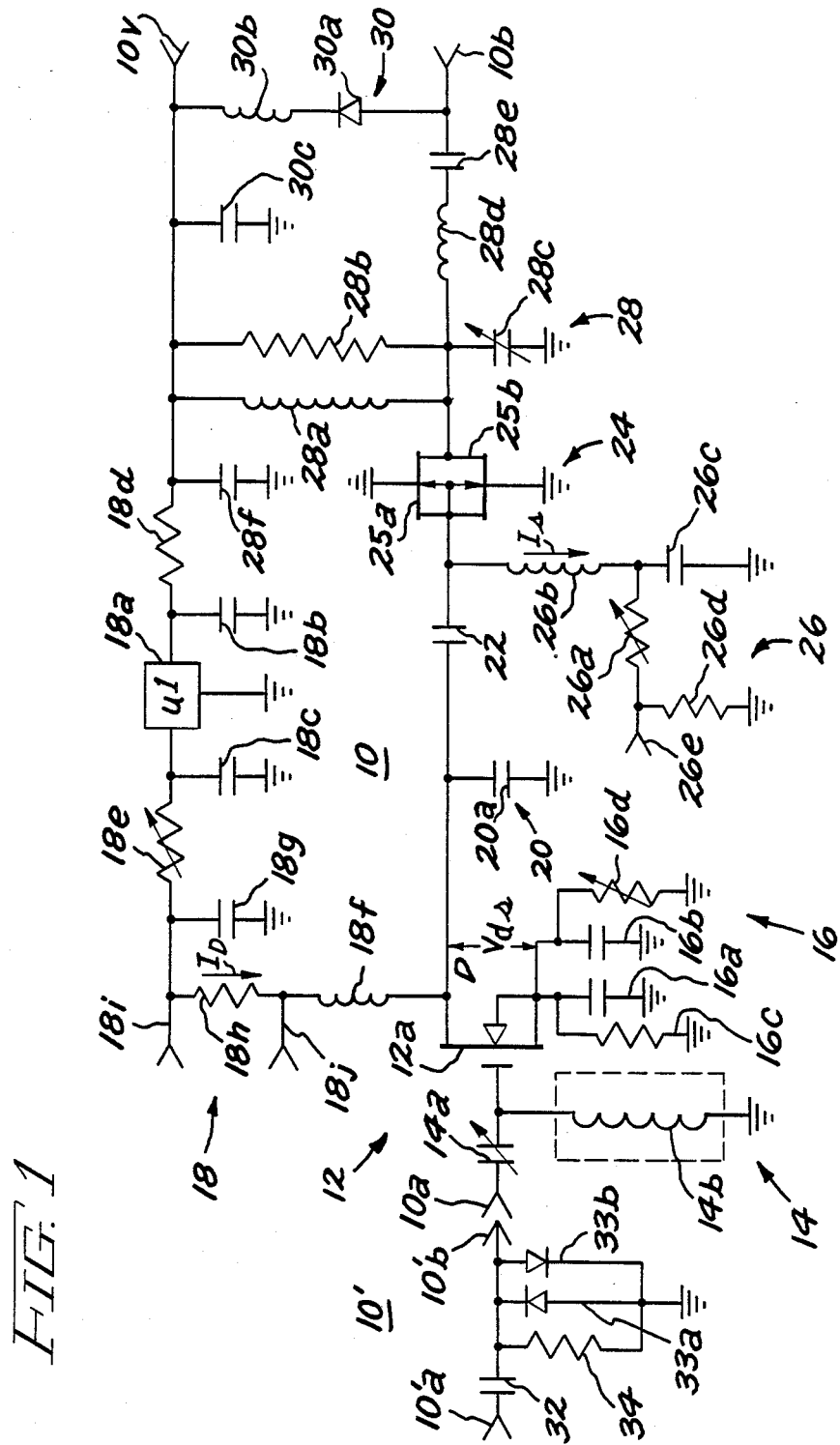
FIG. 1 is a schematic diagram of the novel unconditionally-stable RF preamplifier of the present invention.

Referring initially to FIG. 1, a presently preferred embodiment of my novel unconditionally-stable, ultra-low-noise RF preamplifier circuit 10 is illustrated. Preamplifier 10 receives a signal at a signal input 10a, typically comprised of a coaxial connector appropriate for the frequency and interconnection cables utilized. The RF preamplifier has a first, or low-noise, input stage 12 utilizing a gallium-arsenide MESFET device 12a, such as a type FSC-10LF device (available from Fujitsu Semiconductor) and the like, e.g. a high electron mobility transistor. The GaAsFET device 12a is operated in the common-source configuration. A noise-matching input circuit 14 adjusts the optimum noise impedance at the gate electrode of device 12a to match a preselected RF preamplifier input impedance at input 10a; typically, the RF preamplifier input impedance is on the order of 50 ohms, while the device optimum noise impedance is on the order of several thousand ohms. I presently prefer to utilize an input noise-matching circuit 14 generally comprised of a variable capacitance 14a, connected between input 10a and the device gate electrode, and a high-Q inductance 14b connected between the device gate electrode and the RF preamplifier common potential. Advantageously, inductance 14b is a helically-wound coil of a relatively large diameter (on the order of $\frac{1}{8}$ inch) tubing, supported, if at all, by an extremely low-loss material and typically shielded in a compartment separated from the remainder of the RF preamplifier circuitry. Inductance 14b will typically have a reactance on the order of 250-350 ohms, while variable capacitance 14a will have a reactance on the same order. It should be understood that the reactance of each of noise-matching capacitor 14a and inductor 14b may be individually adjusted to provide the lowest noise figure for RF preamplifier 10. It should also be understood that other noise-matching input circuits can be equally as well used.

The common-source-connected device 12a is biased by a source biasing network 16, comprising an RF bypass capacitor and a biasing resistor from each of the device source leads; typically, device 12a is packaged with a plurality (e.g. 2) of source leads, each of which is bypassed to common potential by a separate bypass capacitor 16a or 16b. The total source resistance, across which a gate-source bias voltage will be generated, is provided by a resistance 16c or 16d connected from each source lead to ground; one of the source resistances (e.g. source resistance 16d) is made variable to allow adjustment of the device 12a drain current $I_D$, for minimum RF preamplifier noise figure.

The input device drain D electron is provided with a DC operating potential from a drain D electrode circuit 18. Circuit 18 includes a voltage regulator means 18a, such as a miniature 3-terminal integrated circuit U1 voltage regulator (e.g. a type 78L05 regulator available from a number of manufacturers). Regulator 18a operates in conjunction with an input filter capacitance 18b and an output filter capacitance 18c, and provides a regulated voltage (e.g. +5 VDC) across output capacitor 18c. A series input resistor 18d, connected to a supply voltage node 18v, is utilized to limit the maximum current drawn by regulator 18a in the event of a regulator output fault. A series variable resistance 18e is utilized to set the drain source voltage $V_{ds}$ across device 12a, after resistance 16d is set for the optimum drain current; the voltage $V_{ds}$ is set to obtain, without appreciably affecting the preamplifier noise figure, a high value of third-order intermodulation intercept point (commonly known as $OIP_3$), to maximize dynamic range. The drain current $I_D$ is provided to the device 12 drain D electron through a radio-frequency choke 18f, which, along with a bypass capacitor 18g, serves to remove RF signals from the DC circuit around regulator 18a. A current-sampling resistance 18h is included in series between the RF choke 18f and resistor 18e, to allow measurement of the device drain current, as by connection of a voltmeter between drain circuit terminals 18i and 18j, by reading the voltage developed across the known value (e.g. 10 ohms) of resistance 18h.

In accordance with one principle of the present invention, a first-stage-load means 20 provides an impedance causing first stage to be unconditionally stable over a broad frequency range. In addition to a substantially resistive portion of load means 20, a reactive portion is also provided at the first stage output (the device 12a drain D electrode). The reactive element can be an inductive element or, as shown, a capacitive element 20a, and can be connected in series or, as shown, in parallel with the first stage output. The reactive value of means 20a is chosen to place the total first stage load impedance at a value such as to assure unconditional stability of the RF preamplifier 10 over the entire frequency range of interest. The substantially-resistive portion of the load is provided, after a series DC-blocking capacitor 22, by an active second stage 24. In order to facilitate the establishment of system noise figure substantially only by the noise figure of the RF preamplifier, the active second stage 24 is designed to have additional gain, such that the entire RF preamplifier 10 has a signal gain, from signal input 10a to a signal output 10b, of at least 20 dB.; even greater gain is often desirable. In order to provide second stage gain, the first stage load must be an active circuit; in order to have the second stage act as a substantially constant resistance, across at least the frequency range of interest, I prefer to have the active load comprised a low-input-impedance active circuit, such as is obtained with at least one device operated in a common-electrode-configuration. By utilizing a plurality of JFET devices 25 in a common-gate configuration (e.g. the pair of devices 25a and 25b, both having their controlled-conduction channels connected in parallel), low input impedance, high signal transconductance and relatively moderate output impedance (on the order of about 500 ohms) can be provided. It will be understood that additional devices 25 can be added to further increase the active load transconductance, and accordingly decrease the effective active load means 20 input impedance. The desired input impedance of the second stage active load is set by adjustment of the total source-electrode current $I_s$ in devices 25, by means of a source resistance component 26a in a source network 26. The DC-setting variable resistance 26a is effectively RF isolated from the second stage active load devices by a series-RF choke inductance 26b and a shunt RF bypass capacitance 26c. Advantageously, a current monitoring resistance 26d is connected in series with variable resistance 26a, so that a voltage can be monitored between circuit common potential and a monitoring connection 26e, to set the total source current $I_s$ of devices 24 to a desired level, for obtaining the desired second stage characteristics (which may be one, or a combination, of maximum gain, maximum output third order intercept and the like qualities).

It will be seen that my preamplifier means is not a normal cascode of two stages, as there is not only no common DC current in the main current circuits of both stages (here, the source-drain circuits) but there is also a plurality of paralleled devices which provide a preselected first stage load resistance. The second stage means 24 includes an output network 28 which allows the flow of DC drain current to devices 25, as through a RF chock 28a, which is shunted by a resistive element 28b of magnitude selected for reducing the output circuit quality factor Q. In the particular output network 28 of this embodiment, a small variable capacitance 28c is connected from the paralleled devices drain electrodes to circuit common potential and is adjusted, in coordination with the inductance of an output series inductor 28d, for maximum gain/best load impedance match at the operating frequency. A series DC-blocking capacitor 28e is coupled between the output inductance 28d and output connector 10b. If desired, the DC potential for operation of the RF preamplifier 10 can be provided on the center conductor of the coaxial cable connected to output connector 10, in manner well known to the art, with the use of a network 30, comprised of a diode 30a, a RF choke 30b and a bypass capacitor 30c, to provide the operating potential at terminal 10v. It will be understood that other output matching circuits can be equally as well utilized in my novel RF preamplifier.

If the RF preamplifier is to operate in an environment in which relatively high levels of RF signal may be incident upon the RF preamplifier input 10a, an additional input protection network 10' may be utilized. The additional protection network is placed between RF connectors 10'a and 10'b, and includes a series coupling capacitor 32, anti-parallel protection diodes 33a and 33b, and a shunt resistance 34 which can also contribute to unconditional stability.

Referring now to FIG. 2, one RF preamplifier 10 was tuned for minimum noise figure (NF) at about 21 MHz. As shown in the graph, wherein abscissa 40 is scaled in units (MHz.) of frequency F and first ordinate 42 is scaled in decibels (dB.) of noise figure, the room temperature noise figure, as shown by a first noise figure curve 44a, had a minimum value of less than 0.25 dB. at the noise-tuned frequency F of 21 MHz. The noise figure was further reduced, as shown in a second noise figure curve 44b, by the simple expedient of placing the RF pramplifier in a water-ice freezer; a minimum noise figure of about 0.15 dB. resulted. When the preamplifier was cooled to liquid nitrogen temperatures (i.e., about 77° K.), the measured noise figure curve 44c resulted, with a minimun noise figure below about 0.05 dB. Using the same abscissa, but with respect to a right-hand ordinate 45, a set of associated gain curves 48a, 48b and 48c were obtained for the respective room temperature, freezer and liquid nitrogen environments. It will be seen that 34-36 dB. of gain was provided at the center frequency. All measurements were made with a Hewlett-Packard HP8970B automatic noise-figure meter with a HP346A noise source. Similar RF preamplifier embodiments, with noise figures less than 0.3 dB. at the center frequency, have been implemented and measured for frequencies over the range from about 15 MHz. to about 500 MHz.

Referring now to FIG. 3, the stability factor K of RF preamplifier 10 is illustrated. The abscissa 50 is scaled in units (MHz.) of increasing frequency F, while ordinate 52 is scaled in increasing units of stability factor K, where, as is well-known in the art, $$K = (1 - |S_{11}|^2 - |S_{22}|^2 + |\Delta|^2)/(2|S_{12}||S_{21}|), \text{ and}$$

$$\Delta = S_{11}S_{22} - S_{12}S_{21},$$

for preamplifier S parameters measured with port 1 at input 10'a and port 2 at output 10b. In all cases, actual measurement of the S parameters and calculation of stability factor K has shown that the worst-case situation occurs very near to, if not at, the tuned frequency, where gain is maximum. As shown by a K curve 54, the K value at F=21 MHz. is greater than 1.00. I have observed that the stability factor K increases as the frequency departs from the minimum-noise-tuned frequency. Thus, the various frequency embodiments of my novel RF preamplifier 10 have all exhibited unconditional stability, as shown by the sample K curve 54 being always greater in value than the minimum (1.00) value (line 56) for unconditional stability.

While a presently preferred embodiment of my novel unconditionally-stable, ultra-low-noise RF preamplifier has been described in detail herein, many modifications and variations will now become apparent to those skilled in the art. It is my intent, therefore, to be limited only by the scope of the appending claims, not by the details and instrumentalities presented by way of explanation of the embodiment described herein.

What I claim is:

1. A radio-frequency preamplifier having a noise figure less than about 0.3 dB. at a selected frequency within a frequency range from about 15 MHz. to about 500 MHz., comprising:

input means for receiving an input signal, from a source with a known source impedance;

output means for providing an output signal to a load impedance;

a first stage comprising a field-effect transistor (FET) in a common-source configuration and having an optimum noise inoput impedance, and means coupled between the FET and the input means for matching an optimum noise-input impedance to the source impedance; and a second stage comprising a plurality N of active devices, all having a controlled-conduction circuit coupled in parallel to one another, to provide an amplified version of said input signal as said output signal to said output means, and to also provide to said first stage a load impedance selected to cause said preamplifier to have a stability factor K greater than 1 over at least said frequency range.

2. The RF preamplifier of claim 1, wherein the first stage FET is a MESFET.

3. The RF preamplifier of claim 2, wherein the MESFET is a gallium-arsenide MESFET.

4. The RF preamplifier of claim 3, wherein the second stage active devices are JFETS.

5. The RF preamplifier of claim 4, wherein all of the JFETs are in a common-gate configuration with source electrodes of all of the JFETs are coupled together to form a second stage input, and drain electrodes of all of the JFETs are coupled together to form a second stage output.

6. The RF preamplifier of claim 5, further comprising means for matching an output impedance of said second stage to the load impedance.

7. The RF preamplifier of claim 5, wherein N=2.

8. The RF preamplifier of claim 1, wherein said second stage further comprises a reactive element coupled to an input of the second stage to modify the reactance of the active load applied to the first stage.

9. The RF preamplifier of claim 8, wherein the reactive element is a capacitor.

10. The RF preamplifier of claim 9, wherein the capacitor is in parallel connection across a first stage output.

11. The RF preamplifier of claim 1, further comprising means for variably setting a drain current flowing through the first stage device.

12. The RF preamplifier of claim 11, further comprising means for variably setting a drain-source voltage across the first stage device.

13. The RF preamplifier of claim 12, further comprising means for variably setting the total current flowing through all of the parallel-connected second stage devices.

14. The preamplifier of claim 1, further comprising means for variably setting the total current flowing through all of the parallel-connected second stage devices.

* * * * *